United States Patent [19]

Chiba et al.

[11] Patent Number: 4,482,912

[45] Date of Patent: Nov. 13, 1984

[54] STACKED STRUCTURE HAVING MATRIX-FIBERED COMPOSITE LAYERS AND A METAL LAYER

[75] Inventors: Akio Chiba; Seiki Shimizu; Keiichi Kuniya; Jin Onuki, all of Hitachi, Japan

[73] Assignee: Hitachi, Ltd., Tokyo, Japan

[21] Appl. No.: 344,976

[22] Filed: Feb. 2, 1982

[30] Foreign Application Priority Data

Feb. 6, 1981 [JP] Japan ............... 56-15695

[51] Int. Cl.³ ............... H01L 23/14; H01L 23/18; H01L 23/54
[52] U.S. Cl. ............... 357/67; 357/71; 357/68; 357/81
[58] Field of Search ............... 357/67, 68, 71, 81

[56] References Cited

U.S. PATENT DOCUMENTS 3,097,329 7/1963 Siemens ............... 357/67
3,858,096 12/1974 Kuhrt et al. ............... 357/81
4,320,412 3/1982 Hynes et al. ............... 357/67

FOREIGN PATENT DOCUMENTS 0040568 9/1977 Japan ............... 357/67
54-78169 6/1979 Japan ............... 357/67
0057851 9/1980 Japan ............... 357/67

*Primary Examiner*—Andrew J. James
*Assistant Examiner*—S. V. Clark
*Attorney, Agent, or Firm*—Antonelli, Terry & Wands

[57] ABSTRACT

Herein disclosed is a stacked or laminated structure which is rigidly integrated by sandwiching a metal layer between a first matrix-fiber composite layer prepared to have as a whole a thermal expansion coefficient and a second matrix-fiber layer prepared to have as a whole another thermal expansion coefficient different from that of the first matrix-fiber composite layer. The intervening metal layer acts as a buffer for the first and second matrix-fiber composite layers. The stacked structure according to the present invention can by used as the chip carrier of a semiconductor device, for example.

12 Claims, 7 Drawing Figures

4,482,912

STACKED STRUCTURE HAVING MATRIX-FIBERED COMPOSITE LAYERS AND A METAL LAYER

BACKGROUND OF THE INVENTION

The present invention relates to a stacked structure having at least two composite layers and a metal layer, this composite layer having a metal matrix and fibers embedded in the matrix. This composite layer, especially, that in which the fibers are selected to have a thermal expansion coefficient lower than that of the metal matrix, preferably, a thermal expansion coefficient equal to or lower than that of a semiconductor material, is satisfactorily used as an electrode plate of a semiconductor device.

The composite layer having a metal matrix and fibers embedded in the former (which composite layer will be referred to simply as the "matrix-fiber composite" hereinafter throughout the specification) is disclosed in detail, by way of example, in U.S. Pat. No. 3,969,754 issued to Kuniya et al. on July 13, 1976, U.S. Pat. No. 4,083,719 issued to Arakawa et al. on Apr. 11, 1978, and U.S. Pat. No. 4,196,442 issued to Kuniya et al. on Apr. 1, 1980, all of which are assigned to the same assignee to that of the present invention. With reference to those U.S. Patents, the general structures, materials, fabrications, applications, advantages and so on of the matrix-fiber composite will be understood by those skilled in the art.

In the only one layer of matrix-fiber composite member to be sandwiched between two members which have thermal expansion coefficients $\alpha$ largely different from each other, e.g., two plates which are made of copper ($\alpha$: $16.5 \times 10^{-6}/°C.$) and silicon ($\alpha$: $3.5 \times 10^{-6}/°C.$), according to the prior art, there has been known a device, in which the distribution of the fibers in the matrix-fibered composite is not homogeneous but the fibers are distributed more in the vicinity of the silicon plate than in the vicinity of the copper plate (See column 3, lines 11 through 17, and column 4, lines 34 to 44 of U.S. Pat. No. 3,969,754). By the aforementioned device, the thermal expansion coefficient $\alpha$ of the matrix-fiber composite is gradually varied in the thicknesswise direction to reduce the thermal distortion.

As a matter of fact, however, it is difficult to fabricate the matrix-fiber composite such that the distribution of the fibers is gradually varied. Moreover, if that fabrication should be possible, the result is that the thermal expansion coefficient $\alpha$ is largely different between the portions in the vicinity of the paired major surfaces of the matrix-fiber composite, respectively. We, the inventors, have therefore found that there arises a problem that warping takes place in the matrix-fiber composite itself. This warping is propagated to a semiconductor chip, which is to be connected with and placed on the matrix-fiber composite, thereby to invite a fear that the electrical characteristics of the semiconductor device are deteriorated.

SUMMARY OF THE INVENTION

It is, therefore, an object of the present invention to provide a stacked structure having at least two matrix-fiber composite layers, each of which has different thermal expansion coefficients $\alpha$ in the thicknesswise direction while reducing the warping.

Another object of the present invention is to provide a highly reliable semiconductor device in which the aforementioned stacked structure is incorporated.

According to a feature of the present invention, there is provided a stacked or laminated structure which is rigidly integrated by sandwiching a metal layer between a first matrix-fiber composite prepared to have as a whole a thermal expansion coefficient $\alpha$ and a second matrix-fiber composite prepared to have as a whole another thermal expansion coefficient $\alpha$ different from that of the first matrix-fiber composite. Here, the intervening metal layer acts as a buffer for the first and second matrix-fiber composite. We have confirmed that the warping is established, although differently in dependent upon the differences in the thermal expansion coefficients $\alpha$, if that metal layer is omitted to directly bond the first and second matrix-fiber composites. According to the construction of the present invention, on the contrary, the substantial warping is not caused even in case the metal layer is made to have a far smaller thickness than those of the first and second matrix-fiber composites.

BRIEF DESCRIPTION OF THE DRAWINGS

FIG. 5A is a top plan view with a cap being removed from the package;

FIG. 5B is a section taken along line VB—VB' of FIG. 5A; and

FIG. 5C is an enlarged view showing the essential portion of FIG. 5B.

Incidentally, all of these Figures are not accurately drawn to scale.

DESCRIPTION OF THE PREFERRED EMBODIMENTS

It has been known in the art that the thermal expansion coefficient $\alpha$ of the matrix-fiber composite as a whole is varied by adjusting the content of the fibers. This fact is exemplified in FIG. 1 corresponding to the data concerning the matrix-fiber composite of the type, in which the matrix and the fibers are made of copper and carbon, respectively, and in which bundles of fibers are embedded in the matrix such that they are knitted in the form of cloth. The data of this graph were used in the embodiments, which will be described hereinafter.

Figure 2:
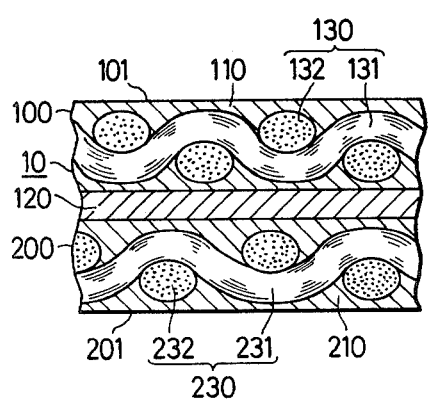
FIG. 2 is a sectional view schematically showing the section of a stacked structure according to the embodiment of the present invention.

A stacked structure 10 according to one embodiment of the present invention is fabricated, as shown in FIG. 2, in a piled form by rigidly and directly joining or bonding a first matrix-fibered composite 100, a metal layer or film 120 and a second matrix-fibered composite 200 in the enumerated order. In the present embodiment, the matrix is made of copper, the fibers are made of carbon, and the metal layer 120 is made of copper. The thicknesses of the first and second matrix-fibered composites 100 and 200 are common to be about 0.5 mm, and the thickness of the metal layer 120 is about 0.02 mm (i.e., 20 $\mu$m) and metal layer 120 contains no fiber.

The first matrix-fibered composite 100 is constructed of a copper matrix 110 and bundles of carbon fibers 130 which are embedded in the copper matrix 110. Each of the bundles 130 is composed of about 3,000 carbon fibers having a diameter of about 7 $\mu$m, each of which has its surface plated with a copper layer having a thickness of 1 to 3 $\mu$m. Bundles 131 and 132 are knitted in the form of cloth, which has its section appearing in FIG. 2. The content of the carbon in the composite 100 is adjusted to be about 55% by volume. This adjustment is achieved by adjusting the quantity of the copper to be coated on the surfaces of the carbon fibers. If only the coating copper is short for the quantity of the copper required, copper powders may be added to the aforementioned cloth-shaped structure at a fabricating process, which will be described hereinafter.

The second matrix-fibered composite 200 has the same construction as that of the first matrix-fiber composite 100 excepting that its carbon content is adjusted to be 45% by volume. The second composite 200 has its bundles of carbon fibers 231 and 232 more coarsely knitted than the first composite 100 so that its carbon content may be lower than that of the first composite 100. Incidentally, reference numeral 210 indicates a copper matrix similar to the copper matrix 110.

Figure 1:
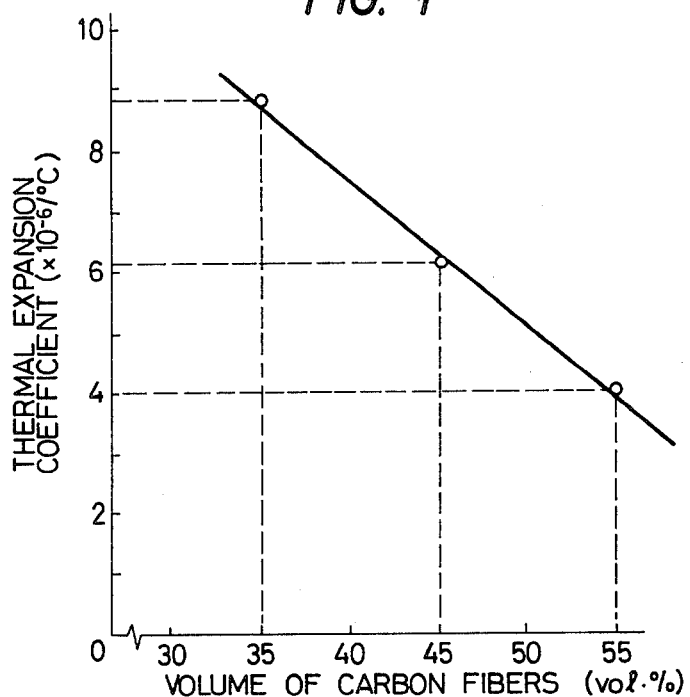
FIG. 1 is a graphical presentation illustrating the plots of the linear thermal expansion coefficient of the composite layer of a copper matrix and carbon fibers, which is used in the embodiment of the present invention, against the volume of the carbon fibers contained in that composite layer.

From the data of FIG. 1, it is understood that the first matrix-fibered composite 100 exhibits a thermal expansion coefficient $\alpha$ of about $4 \times 10^{-6}/°C$. because it contains 55% by volume of carbon whereas the second matrix-fibered composite 200 exhibits of a thermal expansion coefficient $\alpha$ of about $6.2 \times 10^{-6}/°C$. because it contains 45% by volume of carbon. Since the metal layer 120 has a thickness far smaller than that of the first and second matrix-fiber composites 100 and 200 although its material, i.e., the copper has a high thermal expansion coefficient $\alpha$ of about $16.5 \times 10^{-6}/°C$., it does not exert substantial influence upon the apparent thermal expansion coefficient $\alpha$ of the stacked structure 10 as a whole. As a result, the apparent thermal expansion coefficient $\alpha$ of the stacked srructure 10 exhibits an intermediate value between those of the first and second matrix-fiber composites. Moreover, the thermal expansion coefficient $\alpha$ of the stacked structure 10 has values close to that of the first composite 100 itself at the side of the major surface 101 of the first composite 100 and close to that of the second composite 200 itself at the side of the major surface 201 of the second composite 200. As a result, generally speaking, in case members made of materials having thermal expansion coefficients $\alpha$ different from each other are bonded to the paired major surfaces 101 and 201, the stacked structure 10 can enjoy an effect to reduce the thermal distortion which is based upon the difference in the thermal expansion coefficient $\alpha$ between those two members. The embodiment shown in FIG. 2 is useful, as will be detailed hereinafter, in case a silicon semiconductor chip ($\alpha$: $3.5 \times 10^{-6}/°C$.) is bonded to the major surface 101, and a sintered alumina plate ($\alpha$: $6.3 \times 10^{-6}/°C$.) is bonded to the major surface 201.

A preferred example of fabricating the stacked structure shown in FIG. 2 will now be described with reference to FIG. 3. First of all, the aforementioned bundles of carbon fibers 130 and 230 were prepared. The respective fibers had their surfaces coated with the aforementioned material or copper by the electroplating process. The bundles thus coated were knitted to prepare two kinds of clothes. One kind of these contained the carbon fibers in 55% by volume of the total amount of the carbon and copper, whereas the other kind contained 45% by volume of the carbon fibers. A copper layer or film having a thickness of 20 $\mu$m was separately prepared. This copper film was sandwiched between the aforementioned two kinds of clothes thereby to fabricate the desired stacked assembly which was constructed of the cloth (containing the carbon in 55% by volume)—the copper film—and the cloth (containing the carbon in 45% by volume).

Figure 3:
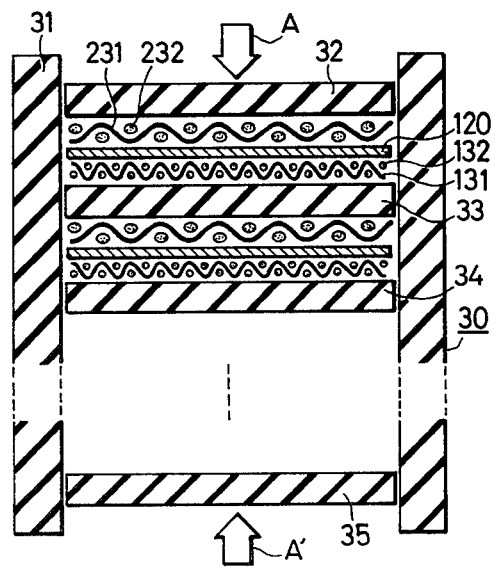
FIG. 3 is a sectional view schematically showing both a method of fabricating the stacked structure according to the embodiment of the present invention and a device to be used for the fabricating method.

Next, as shown in FIG. 3, the stacked assemblies thus fabricated were arranged in a container 30 made of graphite. This container 30 is constructed of an enclosure 31, and a pair of end cap plates 32 and 35 which are positioned at the upper and lower ends of the enclosure 31. Thus, that stacked assembly is sandwiched between the paired end cap plates 32 and 35. In case a plurality of those stacked assemblies are to be simultaneously fabricated, as shown in FIG. 3, partition plates 33, 34 and so on are sandwiched between the stacked assemblies.

The stacked assemblies thus arranged are heated together with the container 30. Simultaneously with this, pressures are applied in the directions indicated at arrows A and A' in FIG. 3. The adjoining stacked assemblies are rigidly and directly joined to each other, as shown in FIG. 2, after they have been held at the aforementioned state for a predetermined time period. The heating temperature is set to be lower than the melting point of the copper. More specifically, the temperature level is preferred to be 600° to 1050° C. and is further preferred to be 800° to 1050° C. from the view point that the joining effect is achieved within a short time period. The preferred pressure level is 200 to 400 Kg/cm². In the present embodiment, the joining process was conducted at a temperature of 1,000° C. and under a pressure of 250 Kg/cm² for 30 minutes. Incidentally, the treatments thus far described were conducted in a hydrogen atmosphere. This hydrogen atmosphere is effective to remove such a variety of oxides in the stacked assembly or assemblies as will frequently deteriorate the thermal conductivity and the mechanical strength of the stacked structure.

Although the stacked structure thus fabricated, as shown in FIG. 2, had been subjected to heat cycles between $-50°$ to $+150°$ C. several ten thousand times, no peeling could be found between the first and second matrix-fiber composites 100 and 200 and the metal layer 120. Nor was observed any substantial warp even if the stacked structure was heated to 400° C.

Applicative embodiments of the present invention will now be described with reference to FIG. 4 and FIGS. 5A, 5B and 5C.

Figure 4:
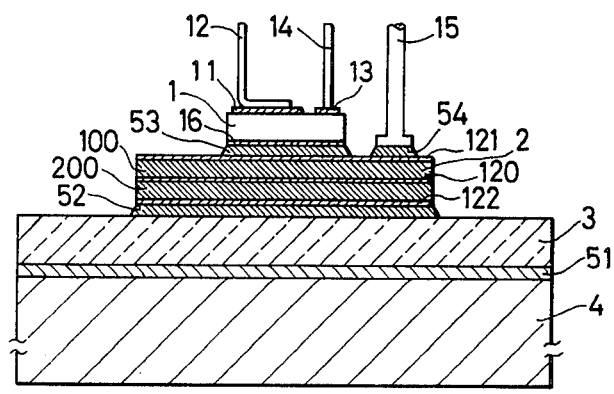
FIG. 4 is a sectional view showing the essential portion of a semiconductor device of insulating type according to another embodiment of the present invention.

FIG. 4 shows a semiconductor device of insulating type, in which the stacked structure shown in FIG. 2 is incorporated as an electro-conducting and heat-dissipating plate. The device of this type has its semiconductor chip and outer support member insulated from each other and can have a hybrid IC and a module device enumerated as its representative examples. To the surface of an outer support plate 4 having a thickness of 3 mm and made of copper, as shown in FIG. 4, there is bonded by means of a solder 51 an insulating plate 3 which is made of sintered aluimna to have a thickness of 0.25 mm and which has its paired major surfaces subjected to the metallizing treatment. To the surface of the insulating plate 3, moreover, there is bonded by means of a solder 52 a heat-dissipating plate 2, to which there are bonded by means of solders 53 and 54, respectively, both a semiconductor chip 1 made of silicon and a lead wire 15. The semiconductor chip 1 supposed here is a three-terminal device such as a thyristor, which has its three electrodes 16, 11 and 13 connected with the plate 2, a lead wire 12 and a lead wire 14, respectively. The solders 52 and 54 are those which have a thickness of 50 $\mu$m and which contain an alloy of Pb-Sn, and the soldering process was conducted at a temperature of 350° C. for 10 minutes.

The heat-dissipating plate 2 used was prepared by rigidly and directly bonding copper layers 121 and 122 to the major surfaces 101 and 201 of the stacked structure shown in FIG. 2. The fabricating method is the same as the aforementioned one except that the stacked assembly has two copper films or layers (which have a thickness of about 20 $\mu$m, for example) added to both the outer surfaces of the paired clothes. Those copper layers 121 and 122 are effective to improve the wettabilities of the solders at the major surfaces of the stacked structure. The heat-dissipating plate 2 thus prepared is used to conduct the heat, which is generated at the chip 1, therethrough to the support plate 4 as satisfactorily as possible. For this purpose, the plate 2 is required to have a high thermal conductivity. At the same time, the plate 2 is also required to reduce the difference in the thermal expansion coefficient $\alpha$ between itself and the semiconductor chip 1. For this latter requirement, the plate 2 is further required to have its thermal expansion coefficient $\alpha$ made close to both those of the silicon and alumina. On the other hand, in case the plate 2 is used as the electro-conducting member, as in the present embodiment, the electric conductivity (between the electrode 16 and the lead wire 15 of the chip 1) is further required to be sufficiently high. Moreover, the warping should be obviated. Nevertheless, the heat-dissipating plate 2, which is used in the present embodiment to have the stacked structure shown in FIG. 2, can satisfy all the requirements thus far described, and neither the warping nor the cracking was found in the respective members after the stacked structure had been completed.

Especially in the hybrid IC or the module device, as is different from a semiconductor device of discrete type which will be described hereinafter, there is a case in which a multiplicity of circuit elements are disposed on the heat-dissipating plate 2. Then, this plate 2 is required to have a large area and a large bonding area at which it is bonded to the insulating plate 3. In this case, both the thermal distortion due to the difference in the thermal expansion coefficient $\alpha$ and the extent of the warp of the plate 2 and/or the insulating plate 3 thus far described are liable to be enlarged. Therefore, the present invention can find its suitable applications to such devices. By the same reason, moreover, the stacked structure according to the present invention can be used as the material for the outer support plate 4.

In order to prevent the warping and cracking from being caused due to the thermal distortion, according to the prior art, the insulating plate 3 has to be made thick thereby to sacrifice the thermal conductivity. According to the present invention, on the contrary, the insulating plate 3 can be made so thin that the thermal conductivity characteristics can be improved while avoiding the generations of the warping and cracking.

Figure 5A:
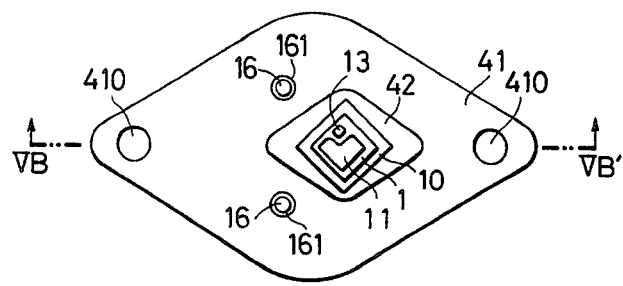
In FIGS. 5A through 5C showing the semiconductor device which is capsulated in a metal package according to still another embodiment of the present invention.
Figure 5B:
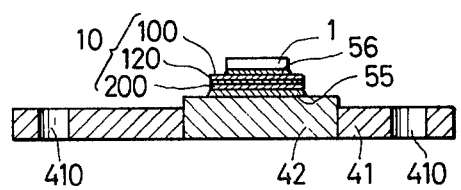
Figure 5C:
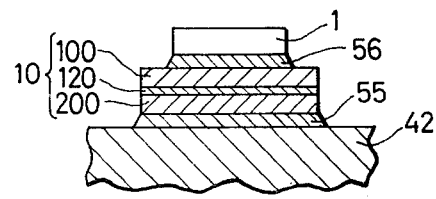

The semiconductor device of discrete type according to still another embodiment of the present invention will now be described with reference to FIGS. 5A, 5B and 5C. As shown in FIGS. 5A and 5B, an inner stem 42 made of copper is fixed by the thermally inserting process to an outer stem 41 made of mild steel. To the upper surface of the inner stem 42, there is bonded by means of a solder 55 to the stacked structure 10 which is shown in FIG. 2. In the present embodiment, however, the matrix-fiber composite 200 at the side of the inner stem 42 of the stacked structure 10 contains the carbon fibers in about 35% by volume. To the surface of the stacked structure 10, there is bonded the semiconductor chip 1 by means of a solder 56 under the bonding conditions similar to those of the foregoing embodiments. The semiconductor chip 1 supposed here is the same as that of FIG. 4. The outer stem 41 is formed with a pair of screw holes 410. Moreover, a pair of lead pins 16 are extended through insulating rings 161 while being insulated from the outer stem 41. For the purpose of clarity, the essential portion of FIGS. 5B is shown in an enlarged scale in FIG. 5C, although the detail construction of the semiconductor chip 1 is not shown.

In order to more effectively dissipate the heat from the semiconductor chip 1 to the outside through the stems, according to the present embodiment, there are placed both the stacked structure 10 and the semiconductor chip 1 on the inner stem 42 which is made of copper having a high thermal conductivity. This inner stem 42 has its periphery rigidly secured by means of the outer stem 41 made of the mild steel so that the thermal expansion coefficient $\alpha$ is made closer to that of the mild steel than the intrinsic coefficient $\alpha$ of the copper. The stacked structure 10 of the present embodiment is formed into such a square with sides of about 7 mm that the coefficient $\alpha$ is made close to that of the silicon at the side of the semiconductor chip 1 and that of the mild steel at the side of the inner stem 42. As a result, there were generated in the respective members neither the warp and crack nor the deteriorations in characteristics by the heat which was applied during the fabrication or operation of the semiconductor device.

The present invention has heretofore been exemplified by way of the several embodiments, it should not be restricted thereto. The present invention can still enjoy modifications, which will be described hereinafter.

First of all, the matrix-fiber composites of the stacked structure according to the present invention and the metal layer to be sandwiched in between can be made of a variety of materials. For example, the matrix of the matrix-fiber composite can be made of silver, aluminum and an alloy composed of at least one of the former two metals and copper. On the other hand, the fibers can be made of tungusten, molybdenum, and an alloy of iron, nickel and cobalt. The arrangements of the fibers in the matrix may be made not only such that the bundles of the fibers are knitted in such a cloth or mesh shape as to intersect at a right angle in a top plan view but also such that a plurality of the arrangements in the one direction are further overlaid in plural layers in different directions or in a spiral shape, and such that pieces of fibers cut relatively short are contained at random. The concrete examples and fabrication methods of the matrix-fibered composite should be referred to the disclosures of the U.S. Pat. Nos. 3,969,754, 4,083,719 and 4,196,442, all of which have already been enumerated hereinbefore. The thermal expansion coefficient α of the matrix-fibered composites is varied with not only the volume of the fibers but also the arrangements of the fibers. In accordance with these arrangements, the non-directional or isotropic arrangement is preferred in view of the applications. The arrangements of the aforementioned embodiments are substantially non-directional.

As the material for the metal layer or film or foil disposed at the intermediate position of the stacked structure, the same metal as that of the matrix is preferred from the standpoint of the adhesiveness, but a metal other than that of the matrix may be used. For example, the metal layer may be made of an alloy of iron and nickel, an alloy of iron, nickel and cobalt, and an alloy named Invar. The metal having a higher rigidity than the matrix is preferred to reduce the warping. The metal layer is made to have a thickness of about 20 to 100 μm smaller than that of the matrix-fiber composite in case this composite is made to have a thickness of about 0.4 to 0.5 mm. In case the thickness of the composite is changed from the above-specified value, the thickness of the metal layer is proportionally changed. Specifically, the thickness of the metal layer is preferred to be ¼ to 1/25 as large as that of the composite.

The aforementioned fabrication method of the stacked structure is preferred because it can bear a satisfactory result relatively simply. The rolling and pressure welding methods can be additionally used. Moreover, a method can be resorted, in which the first and second matrix-fiber composites 100 and 200 shown in FIG. 2 are separately prepared and are then joint to each other while sandwiching the metal layer 120 in between. No matter whichever method may be used, it is important for enhancing the joining strength that the atoms composing the matrix of the matrix-fibered composite and the atoms composing the metal of the metal layer be diffused by that joining treatment. This condition is satisfied by the methods of the foregoing embodiments.

If desired, incidentally, the construction of the stacked structure may be made such that the aforementioned three layers are included to alternately overlay another matrix-fiber composite or other matrix-fibered composites on another metal layer or other metal layers.

In addition to the embodiments, the buffer electrodes of the power semiconductor devices, which are disclosed in the U.S. Pat. No. 3,969,547, for example, are useful as the application of the present embodiment.

What is claimed is:

1. A stacked structure comprising:
a first composite layer including a first metal matrix and first fibers embedded therein, which first fibers have a thermal expansion coefficient lower than that of said first metal matrix so that said first composite layer has as a whole a first thermal expansion coefficient lower than that of said first metal matrix;
a second composite layer including a second metal matrix and second fibers embedded therein, which second fibers have a thermal expansion coefficient lower than that of said second metal matrix so that said second composite layer has as a whole a second thermal expansion coefficient lower than that of said second metal matrix; and
a metal layer sandwiched between said first and second composite layers and joined directly and rigidly to said first and second composite layers, wherein said second thermal expansion coefficient of said second composite layer is lower than said first thermal expansion coefficient of said first composite layer;
said first and second metal matrices are made of the same metal;
said first and second fibers are made of the same material and are arranged non-directionally respectively; and
said metal layer is thinner than said first and second composite layers.

2. A stacked structure of a layered shape for an electrically conducting member to be incorporated in a semiconductor device, in which said stacked structure is sandwiched between at least one semiconductor chip and a supporting member, said stacked structure comprising:
a first composite layer including a first metal matrix and first fibers embedded therein, which first fibers have a thermal expansion coefficient equal to or lower than that of the semiconductor to the extent that said first composite layer has as a whole a first thermal expansion coefficient close to that of the semiconductor;
a second composite layer including a second metal matrix and second fibers embedded therein, which second fibers have a thermal expansion coefficient equal to or lower than that of said second metal matrix to the extent that said second composite layer has as a whole a second thermal expansion coefficient close to that of the supporting member; and
a metal layer sandwiched between said first and second composite layers and joined directly and rigidly to said first and second composite layers wherein said first and second metal matrices are made of the same metal;
said first and second fibers are made of the same material and are arranged non-directionally respectively; and
said metal layer is thinner than said first and second composite layers.

3. A stacked structure as claimed in claim 1 or 2, wherein said first and second metal matrices and said metal layer are made of the same metal.

4. A stacked structure as claimed in claim 1 or 2, wherein said first and second fibers are embedded in said first and second metal matrices in a form of knitted cloth, respectively.

5. A stacked structure claimed in claim 1 or 2, wherein said metal layer is made of a metal having a larger rigidity than those of said first and second metal matrices.

6. A stacked structure claimed in claim 1 or 2, wherein the thickness of said metal layer is 1/25 to ¼ times as large as those of said first and second composite layers.

7. A stacked structure as claimed in claim 1 or 2, wherein said first and second metal matrices are made of copper and said first and second fibers are made of carbon.

8. A stacked structure as claimed in claim 2, wherein said supporting member is made of an insulator.

9. A stacked structure as claimed in claims 1 or 2, wherein said first and second metal matrices and said metal layer are made of copper and said first and second fibers are made of carbon.

10. A stacked structure according to claim 1 or 2, wherein the metal layer is joined directly and rigidly to said first and second composite layers by applying heat and pressure to the first and second composite layers having the metal layer sandwiched therebetween.

11. A stacked structure as claimed in claim 10, wherein the heating temperature for joining the metal layer to the first and second composite layers is 600°–1050° C.

12. A stacked structure according to claim 11, wherein the pressure for joining the metal layer to the first and second composite layers is 200 to 400 kg/cm².

* * * * *